United States Patent
Rozzi et al.

(10) Patent No.: US 10,129,996 B2
(45) Date of Patent: Nov. 13, 2018

(54) HIGH-PRESSURE CARD LOCKS FOR MAXIMIZING HEAT TRANSFER FROM ELECTRONICS CARDS TO CARD CAGES

(71) Applicant: Creare LLC, Hanover, NH (US)

(72) Inventors: Jay C. Rozzi, Hanover, NH (US); Thomas M. Conboy, Hanover, NH (US); Nicholas T. Kattamis, Lebanon, NH (US); Christopher B. Munro, Enfield, NH (US); John W. Osborne, Henniker, NH (US)

(73) Assignee: Creare LLC, Hanover, NH (US)

( * ) Notice: Subject to any disclaimer, the term of this patent is extended or adjusted under 35 U.S.C. 154(b) by 0 days.

(21) Appl. No.: 15/165,685

(22) Filed: May 26, 2016

(65) Prior Publication Data

US 2017/0257966 A1    Sep. 7, 2017

Related U.S. Application Data

(60) Provisional application No. 62/302,330, filed on Mar. 2, 2016.

(51) Int. Cl.
*H05K 7/14* (2006.01)
*H05K 7/20* (2006.01)

(52) U.S. Cl.
CPC ......... *H05K 7/1424* (2013.01); *H05K 7/1404* (2013.01); *H05K 7/2039* (2013.01)

(58) Field of Classification Search
CPC ... H05K 7/1424; H05K 7/1404; H05K 7/2039
See application file for complete search history.

(56) References Cited

U.S. PATENT DOCUMENTS

| | | | | |
|---|---|---|---|---|
| 4,823,951 A | * | 4/1989 | Colomina | H05K 7/1404 206/707 |
| 5,220,485 A | * | 6/1993 | Chakrabarti | H05K 7/1404 165/185 |
| 5,382,175 A | * | 1/1995 | Kunkel | H05K 7/1404 29/525.09 |
| 5,711,628 A | * | 1/1998 | Fletcher | F16B 2/04 403/31 |

(Continued)

OTHER PUBLICATIONS

Birtcher, "Rugged Printed Circuit Board Hardware", vol. 2, 2010 Edition.

*Primary Examiner* — David M Sinclair
*Assistant Examiner* — Robert Brown
(74) *Attorney, Agent, or Firm* — Downs Rachlin Martin PLLC

(57) ABSTRACT

Card locks for securing electronics card in card slots within cages and designed and configured to allow each card lock to impart high uniform pressure between an electronics card and the corresponding card slot to maximize heat transfer from the electronics card to the card cage to efficiently sink heat generated onboard the electronics card. In some embodiments, a high-pressure card lock of the present disclosure has a pair of low-angle wedges and a locking mechanism that effectively pushes one of the wedges along the other wedge to put the high-pressure card lock into its locked, high-pressure-exerting state. In other embodiments, a high-pressure card lock of the present disclosure has a pair of low-angle wedges and a locking mechanism that effectively draws one of the wedges along the other wedge to put the high-pressure card lock into its locked, high-pressure-exerting state.

17 Claims, 8 Drawing Sheets

(56) References Cited

U.S. PATENT DOCUMENTS

| | | | | | |
|---|---|---|---|---|---|
| 5,779,388 | A * | 7/1998 | Yamamoto | ............ | H05K 7/1404 361/741 |
| 5,859,764 | A * | 1/1999 | Davis | ................ | H05K 7/20545 165/80.3 |
| 7,349,221 | B2 * | 3/2008 | Yurko | ................ | H05K 7/1404 165/80.2 |
| 7,883,289 | B2 * | 2/2011 | Weisman | ............. | H05K 7/1407 403/374.4 |
| 8,967,903 | B1 * | 3/2015 | Sharfi | .................... | F16B 12/40 403/374.4 |
| 9,466,551 | B1 * | 10/2016 | Reist | .................... | H01L 23/473 |
| 9,681,584 | B2 * | 6/2017 | Wong | ................... | H05K 7/1404 |
| 2002/0052132 | A1 * | 5/2002 | Sato | ....................... | G06K 13/08 439/159 |
| 2003/0048049 | A1 * | 3/2003 | Seal | ......................... | F16B 2/14 312/294 |
| 2003/0048618 | A1 * | 3/2003 | Adams, Sr. | .......... | H05K 7/1404 361/740 |
| 2006/0085962 | A1 * | 4/2006 | Kerrigan | ................. | G06F 1/185 29/426.5 |
| 2007/0253169 | A1 * | 11/2007 | Clawser | ............... | H05K 7/1404 361/720 |
| 2008/0171462 | A1 * | 7/2008 | Wu | ...................... | H01R 13/633 439/325 |
| 2008/0239690 | A1 * | 10/2008 | Harvey | ................ | H05K 7/1404 361/808 |
| 2010/0020514 | A1 * | 1/2010 | Lee | ...................... | H05K 7/1404 361/801 |
| 2012/0113589 | A1 * | 5/2012 | Sporer | ................. | H05K 7/1404 361/679.54 |
| 2013/0003316 | A1 * | 1/2013 | Martin | ................ | H05K 7/2049 361/720 |
| 2016/0338215 | A1 * | 11/2016 | Paykarimah | ......... | H05K 7/1418 |
| 2016/0353597 | A1 * | 12/2016 | Gilmore | ................ | H05K 7/1404 |

* cited by examiner

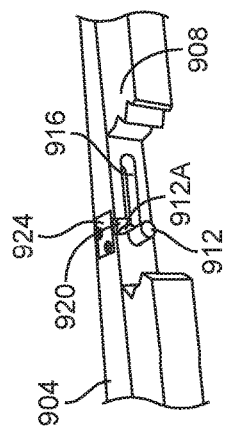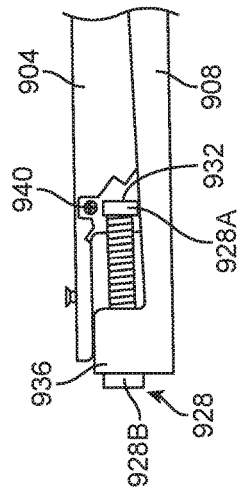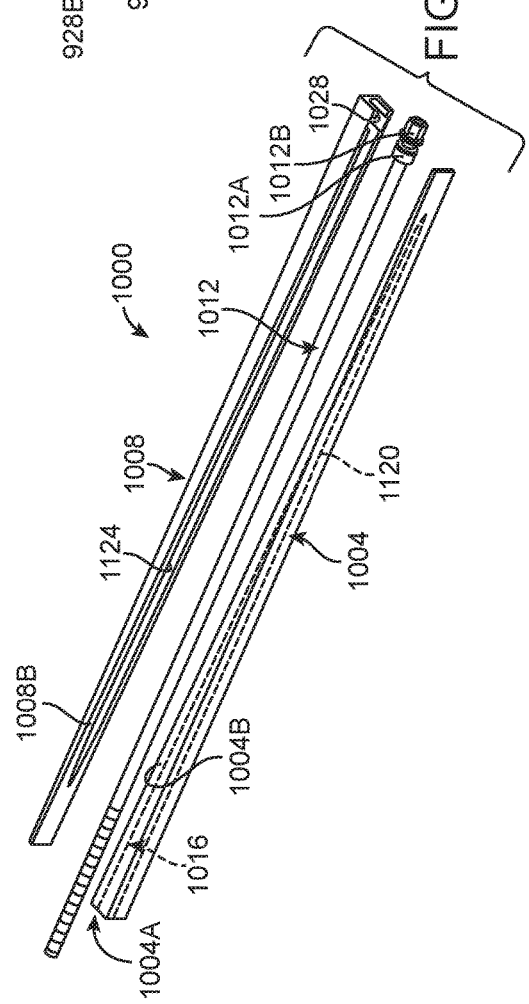

HIGH-PRESSURE CARD LOCKS FOR MAXIMIZING HEAT TRANSFER FROM ELECTRONICS CARDS TO CARD CAGES

RELATED APPLICATION DATA

This application claims the benefit of priority of U.S. Provisional Patent Application Ser. No. 62/302,330 filed on Mar. 2, 2016, and titled "HIGH-PRESSURE CARD LOCKS FOR MAXIMIZING HEAT TRANSFER FROM ELECTRONIC CARDS TO CARD CAGES," which is incorporated herein in its entirety.

STATEMENT REGARDING FEDERALLY SPONSORED RESEARCH OR DEVELOPMENT

This invention was made with Government support under Air Force Small Business Innovation Research Contracts FA9453-13-M-0078 and FA9453-14-C-0296. The Government may have certain rights in this invention.

FIELD OF THE INVENTION

The present invention generally relates to the field of card-based electronics systems. In particular, the present invention is directed to high-pressure card locks for maximizing heat transfer from electronics cards to card cages.

BACKGROUND

Card locks are often used to secure electronics cards in a card cage that includes a heat dissipating chassis. The chassis is typically thermally connected to a heat rejection system comprising a radiator that radiates heat to the environment in a space application or a convective heat exchanger that transfers heat to the surrounding air in a medical, aircraft, mobile communications, aerospace, and ruggedized land transport application. There is a strong desire in current systems to maximize the rate of heat transfer to enable the use of more powerful electronics cards that generate more heat requiring dissipation. However, redesigning the chassis or the heat rejection system is expensive and difficult.

SUMMARY OF THE DISCLOSURE

In one implementation, the present disclosure is directed to a card lock for locking an electronics card into a card cage. The card lock includes a first wedge that tapers in thickness from a first end to a second end, a second wedge that tapers in thickness from a third end to a fourth end, wherein the second wedge is located so that the third end is located proximate to the force-resisting member, and a locking mechanism that includes a fixed portion fixedly secured to the first wedge at the second end of the first wedge, and a pusher engaged with each of the fixed portion and the second wedge, the pusher designed and configured to act against the fixed portion so as to push the second wedge along the first wedge.

In another implementation, the present disclosure is directed to an assembly that includes a chassis having at least one card slot having a thermally conductive sidewall, an electronics card having a length, the electronics card engaged in the at least one card slot so as to be in contact with the thermally conductive sidewall along the length of the electronics card, and a card lock wherein the card lock is engaged in the at least one card slot so as to force the electronics card into firm contact with the thermally conductive sidewall so that pressure of the electronics card against the thermally conductive sidewall is at least 85 psi (0.59 MPa) along substantially the entire length of the portion of the card lock in contact with the electronics card.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein:

FIG. 9A is an isometric view of an alternative high-pressure card lock made in accordance with aspects of the present invention;

FIG. 9B is an enlarged, partial, and cutaway isometric view of the high-pressure card lock of FIG. 9A showing a securing pin feature for securing the two wedges together at a location distal from the locking screw;

FIG. 9C is an enlarged, partial, and partial-cutaway isometric view of the high-pressure card lock of FIG. 9A showing engagement of the locking screw with the movable wedge; and FIG. 10 is an exploded isometric view of another alternative high-pressure card lock made in accordance with aspects of the present invention.

DETAILED DESCRIPTION

In some embodiments, the present invention is directed to card locks that provide high pressure and highly uniform pressure against removable electronics cards to not only secure the electronics cards in an electronics chassis but to also provide a heat flow path having relatively low thermal resistance directly between the electronics cards and the chassis to efficiently and effectively transfer heat from the electronics cards to the chassis and, in turn, to the heat rejection system. Such a chassis and electronics cards are used in many settings, including in spacecraft and aircraft and in terrestrial settings. A deficiency of conventional card locks is that their use does not result in optimal heat transfer from the electronics cards to a chassis. In some cases, designers have made card locks of highly thermally conductive materials, such as copper (see, e.g., U.S. Pat. No. 5,859,764 issued on Jan. 12, 1999, and titled "ELECTRONICS PACKAGE EMPLOYING A HIGH THERMAL PERFORMANCE WEDGELOCK" ("the '764 patent")). While these card locks may be excellent thermal conductors in and of themselves, the direct heat transfer between the electronics cards and chassis is still less than optimal.

The present inventors have found that the heat transfer between an electronics card and an electronics chassis is greatly improved by developing very high pressure and uniform contact of the electronics card with the chassis so that the primary flow of heat is directly through card/chassis interface. Indeed, the present inventors have discovered that when a card lock can press an electronics card against a thermal interface of an electronics chassis with sufficiently high pressure and uniform contact, the card lock itself does not need to be highly thermally conductive. This is so because with such high and uniform pressure, the heat flow from the card directly to the thermal interface of the electronics chassis is so efficient that any contribution to heat flow by a conductive card lock can be considered negligible. That said, a card lock of the present disclosure can, if desired, be made of one or more materials having high thermal conductivity.

Figure 1:
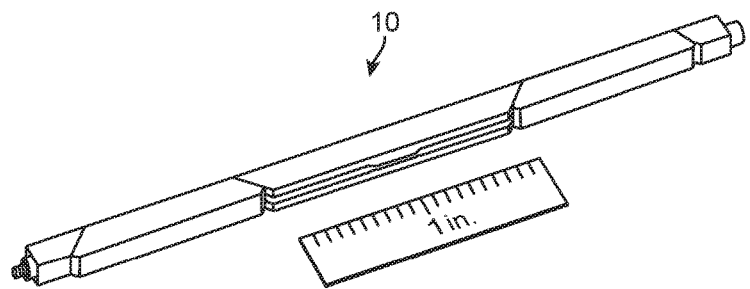
FIG. 1 is a perspective view of a prior art multi-segment card lock.

Conventional commercial off the shelf (COTS) card locks, on the other hand, such as COTS card lock 10 of FIG. 1, are not capable of developing the high pressure and uniform contact needed to effect such effective heat flow. To overcome limitations associated with conventional wedge locks, each high-pressure card lock made in accordance with the present invention is comprised of two inclined wedges each having, among other things, an inclination angle of about 5° or less, low friction interfaces, robust materials, and high-strength locking/unlocking mechanisms. Several examples of high-pressure card locks are illustrated and described herein.

In between the electronics card and the heat sink (e.g. radiator) are a number of thermal resistances that impede the total possible heat transfer. Such resistances include conduction through solid materials, heat transfer across interfaces, and the effectiveness of the heat rejection to the environment or surroundings. The specific resistance, $R'_C$, is defined as:

$$R'_C = \frac{L \, \Delta T}{q}$$

wherein L (in.) is the card length, q is the total heat load (W), and ΔT is the temperature difference across the interface (° C.). In the above equation, the allowable temperature difference is typically fixed. Hence, the only way to increase the total heat transfer rate from the card to the heat rejection system is to reduce the overall thermal resistance.

Among the many thermal resistances between the electronics card and the heat rejection system, one of the largest is the contact resistance between the card and the electronics chassis. Typically, electronics cards are secured to the chassis by means of a COTS card lock, often the COTS card lock 10 of FIG. 1. This simple device is placed in the channel groove that also receives an edge of an electronics card and imparts a force on the card that pushes it against the opposite channel wall. In doing so, it applies pressure to the card and forms a thermal connection with the chassis. The magnitude of the pressure distribution that the card lock imparts to the card-chassis interface significantly influences the overall thermal resistance of the joint.

The current COTS multi-wedge card locks (known commercially as "Wedge-Locks" and represented by COTS card lock 10 of FIG. 1) supply enough force and pressure to hold the cards in place during operation; however, the non-uniformity of the pressure distribution results in poor heat transfer performance. The non-uniformity and relatively low magnitude of the pressure distribution results in a relatively high thermal resistance at the card chassis interface of ~1° C.-in/W or more. Roughly, the thermal resistance of the card chassis interface is inversely proportional to pressure. In addition, the total thermal resistance of the joint is inversely proportional to the area of interaction between the mating surfaces.

Figure 2A:
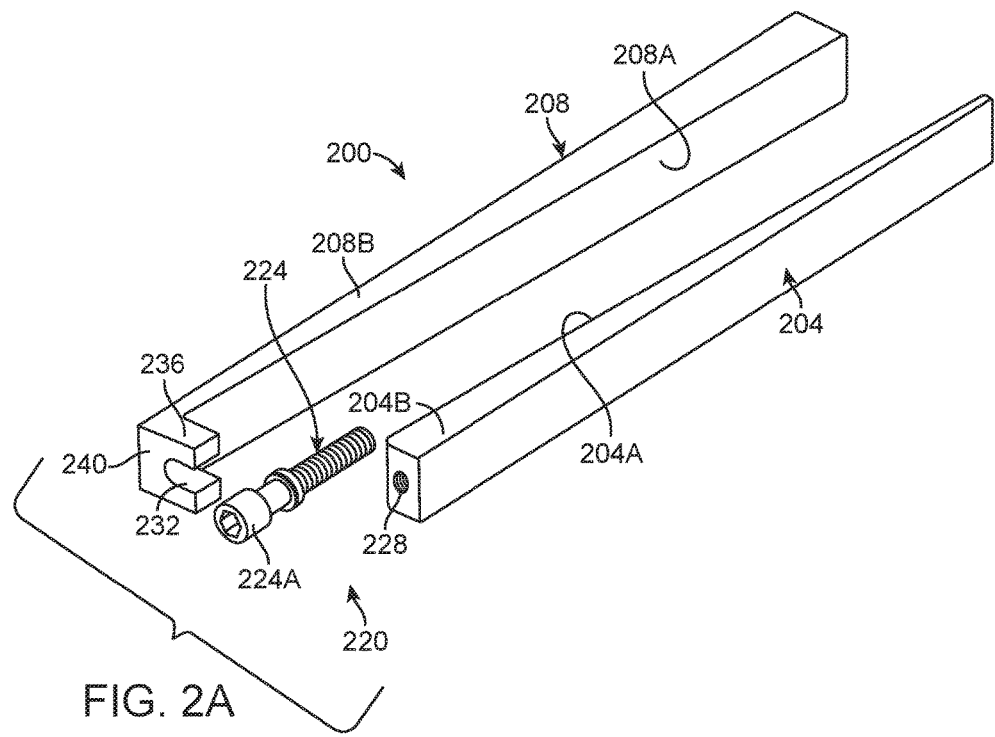
FIG. 2A is an exploded isometric view of a high-pressure card lock made in accordance with aspects of the present invention.
Figure 2B:
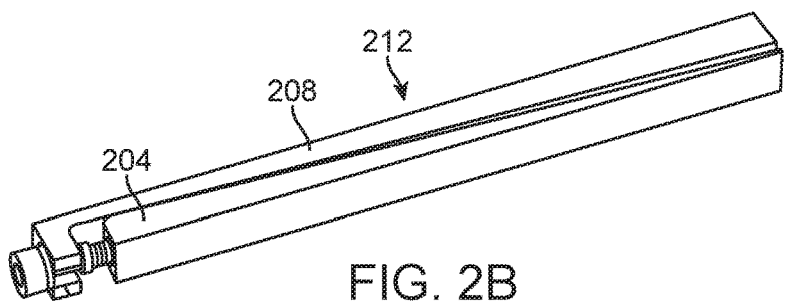
FIG. 2B is an isometric view of the high-pressure card lock of FIG. 2A, showing the movable wedge in an extended, card-locking, position relative to the stationary wedge.
Figure 2C:
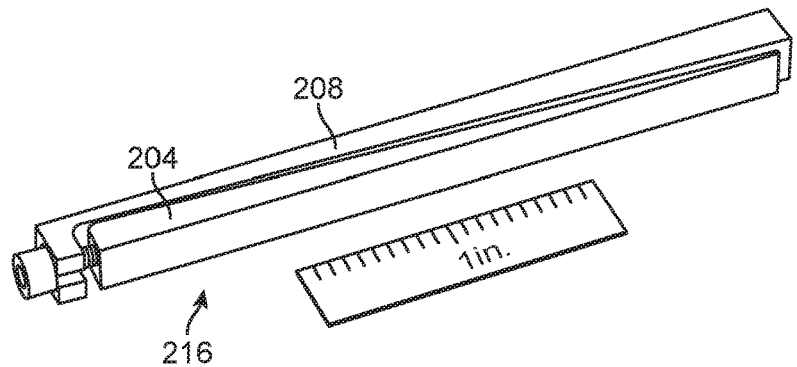
FIG. 2C is an isometric view of the high-pressure card lock of FIG. 2A, showing the movable wedge in a retracted, unlocked, position relative to the stationary wedge.
Figure 3A:
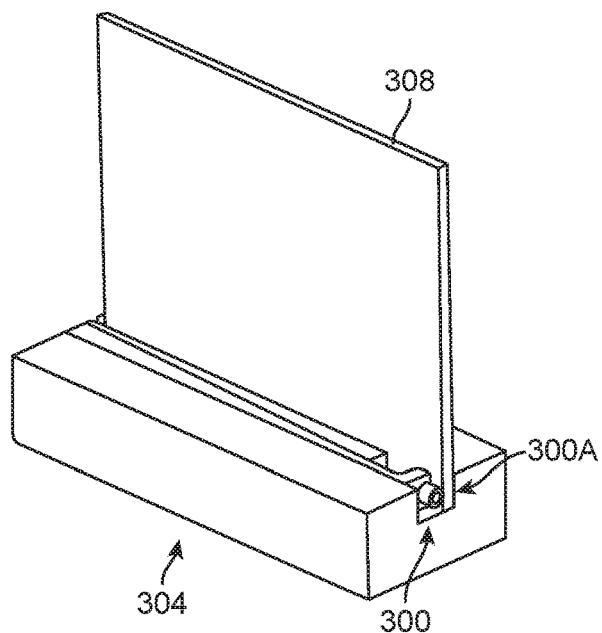
FIG. 3A is an isometric partial view of an electronics card locked into a card-receiving channel of an electronics chassis by a high-pressure card lock made in accordance with aspects of the present disclosure.
Figure 3B:
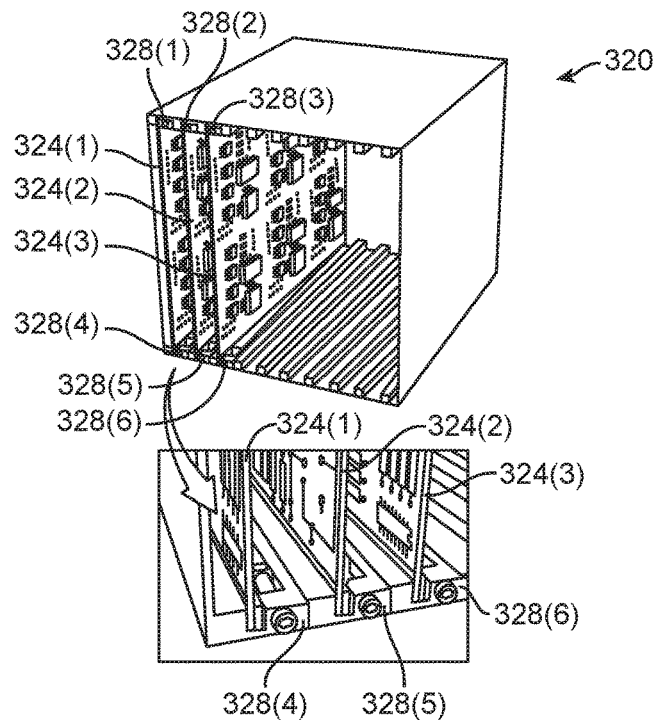
FIG. 3B is an isometric view and enlarged view of a card cage containing multiple electronics cards each secured into place by a pair of high-pressure card locks made in accordance with aspects of the present disclosure.

FIG. 2A illustrates an exemplary high-pressure card lock 200 of the present invention in an exploded view. This high-pressure card lock includes a first, or movable, wedge 204 that when inclined faces 204A and 208A are engaged with one another, slides with respect to a second, or fixed, wedge 208, causing the lock to expand laterally in a card slot (such as card slot 300 of FIG. 3A of an electronics chassis 304) so as to apply a uniform, high pressure to the bottom of the electronics card (here, electronics card 308) that forces it against a thermally conductive sidewall (here, sidewall 300A) of the chassis. Both wedges 204 and 208 in FIG. 2A are solid wedges to maximize the structural rigidity and robustness of high-pressure card lock 200, which enables the application of a high and uniform pressure to the card-chassis interface, as described in more detail below. The application of higher pressures with higher uniformity and areal coverage increases the achievable heat transfer rates. FIG. 3B illustrates an electronics chassis 320, or card cage, containing several electronics cards 324(1) to 324(3) and corresponding high-pressure card locks 328(1) to 328(6) that are similar to high-pressure card lock 200 illustrated in FIG. 2A. FIGS. 2B and 2C illustrate two exemplary configurations 212 and 216, respectively, of high-pressure card lock 200 of FIG. 2A, showing their simple, yet robust, construction. FIG. 2B illustrates high-pressure card lock 200 with movable wedge 204 in an extended position relative to stationary wedge 208, which occurs when the high-pressure card lock is deployed and in-use. FIG. 2C, on the other hand, illustrates high-pressure card lock with movable wedge 204 in a retracted position relative to stationary wedge 208, which occurs, for example, when the high-pressure card lock is first installed in an electronics-card-receiving channel of an electronics chassis.

A basis of the inclined wedge design is indicated by a comparison of force balance on a conventional multi-wedge card lock (e.g., as shown by multi-segment card lock 10 of FIG. 1) with a force balance on a card lock made in accordance with the present invention. A force balance on a conventional wedge-lock design yields:

$$M_{Wedge} = (N-1)\left(\frac{\cos\theta - \mu\sin\theta}{\mu\cos\theta + \sin\theta}\right)$$

wherein M is the force multiplier, i.e., the ratio of the force manifested at the interface between the card and wedge-lock, divided by the applied force (torque) to the wedge-lock itself. The wedge angle is represented by θ, and the friction coefficient between the sliding surfaces is given by μ. N represents the total number of active wedges in the lock, including the end wedges. For conventional wedge-locks, θ is a minimum of 45°. For a 5-inch wedge-lock with three active wedges, this results in a force multiplier of 3.3 for a μ of 0.1.

A force balance on a high-pressure card lock of the present invention yields:

$$M_{Incline} = \frac{\cos\theta - \mu\sin\theta}{\mu\cos\theta + \sin\theta}$$

Figure 4:
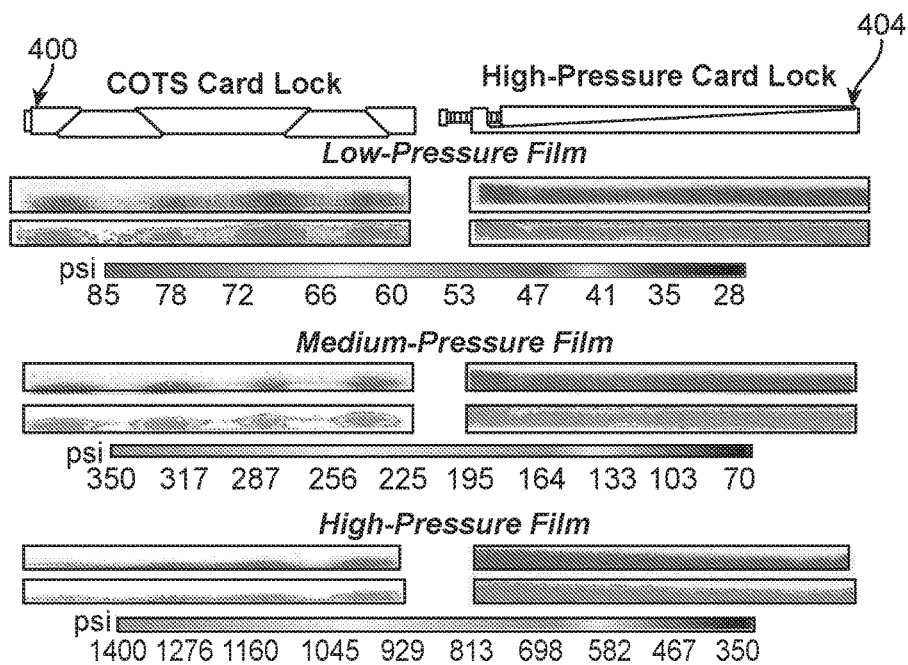
FIG. 4 are pressure profiles for each of a prior art card lock (left-hand side) and a high-pressure card lock of the present disclosure (right-hand side) using low-, medium-, and high-pressure films.

In an exemplary 5-inch inclined wedge design, θ is approximately 3°, which results in a force multiplier of 6.6 for a μ of 0.1. Notably, the inclined wedge design produces a force multiplication 2 times higher than the conventional multi-wedge card lock. In addition, because the inclined wedge design of a high-pressure card lock of the present disclosure is more rigid, the applied pressure is much more uniform, further reducing the thermal resistance at the card-chassis interface. The high rigidity of the inclined wedge design enables the applied torque to increase, further increasing the applied force between the card and the inclined wedge design, relative to the conventional wedge lock. Exemplary pressure measurements are illustrated in FIG. 4, for, respectively, a COTS card lock 400 (left-hand side of FIG. 4) and a high-pressure card lock 404 made in accordance with the present invention (right-hand side of FIG. 4) and is the same as or nearly the same as high-pressure card lock 200 of FIG. 2A. As noted in FIG. 4, the pressure measurements illustrated in FIG. 4 were made using three pressure-sensitive films having differing sensing ranges namely a low pressure film having a sensing range of 28 psi to 85 psi (~193 kPa to ~586 kPa), a medium pressure film having a sensing range of 70 psi to 350 psi (~483 kPa to ~2.4 MPa), and a high pressure film having a sensing range of 350 psi to 1400 psi (~2.4 MPa to ~9.7 MPa).

Figure 5:
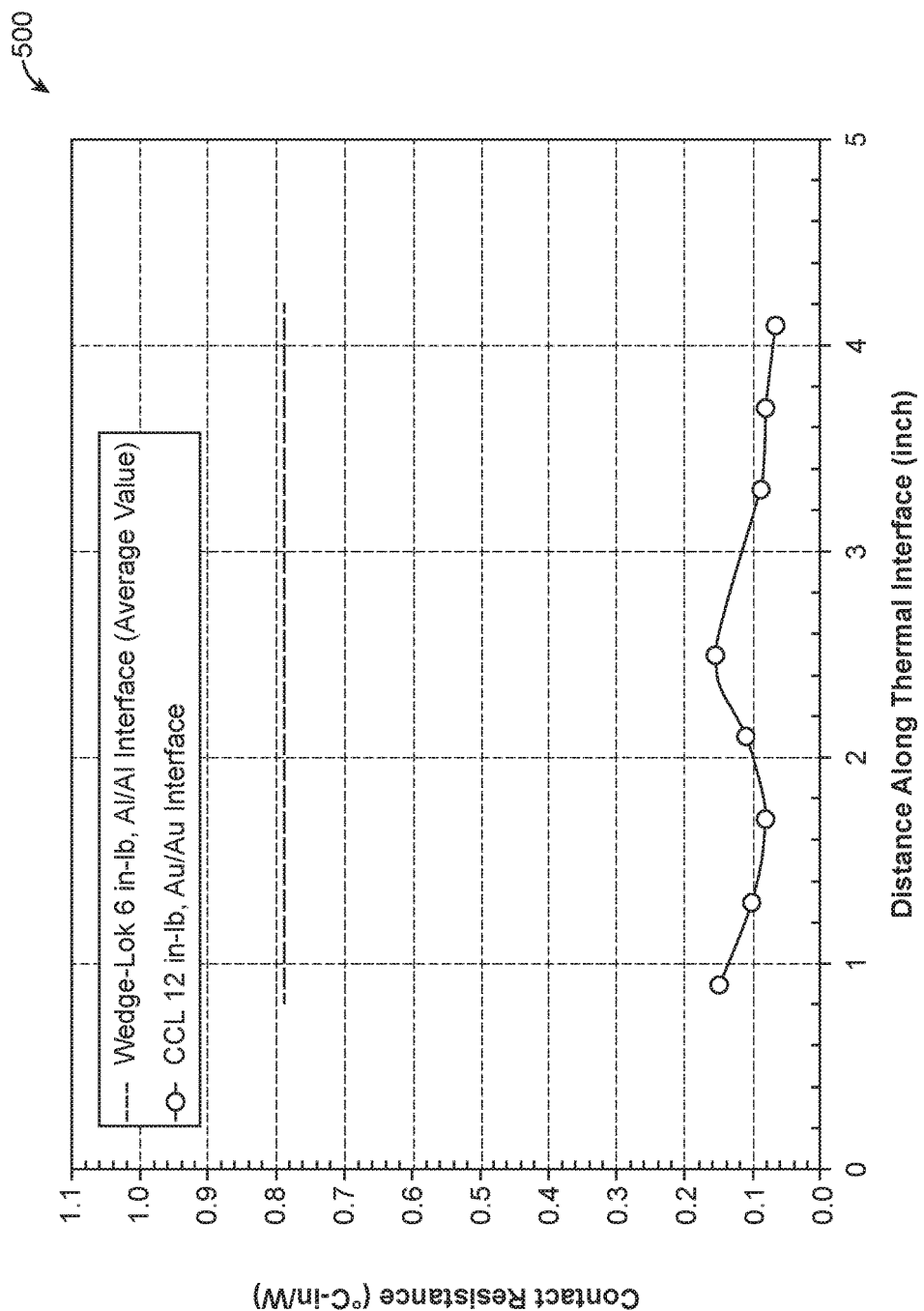
FIG. 5 is a graph of contact resistance versus distance along the thermal interface between an aluminum-aluminum interface for a prior art card lock and a gold-gold interface for a high-pressure card lock of the present disclosure.

Looking at the pressure results using the intermediate pressure-sensitive film in FIG. 4, tested high-pressure card lock 404 of the present disclosure increases pressure uniformity along the thermal interface both in the width and length directions and increases the contact area. Side-by-side comparison of both approaches in FIG. 4 results in a 275% increase in active contact area and a 350% increase in net contact force. Exemplary high-pressure card lock 404 tested in connection with generating the data of FIG. 4 reduced the card-chassis thermal resistance by a factor of 7 or more when compared to manufacturer data (see Birtcher, "Rugged Printed Circuit Board Hardware", Vol. 2, 2010 Edition) (See graph 500 of FIG. 5). Additionally, the increased pressure uniformity of the card lock increases the flexibility of the electrical system designer. Currently, the non-uniformities associated with standard card locks (See graph 700 of FIG. 7) constrain the placement of high heat-dissipating electrical components on the card. A card lock of the present disclosure eliminates this constraint.

Depending on the inclination angle of the wedges and the friction coefficient between the wedges, such as wedges 204 and 208 of FIG. 2A, the pressure that can be developed by a card lock of the present disclosure against an electronics card can be 85 psi (0.59 MPa) or greater. For example, in some embodiments this pressure can be at least 350 psi (2.41 MPa), at least 1000 psi (6.90 MPa), or at least 1400 psi (9.65 MPa), among others. As just noted, this pressure is highly uniform across the length and width of the entire face of the wedge of the card lock contacting the electronics card.

Figure 6:
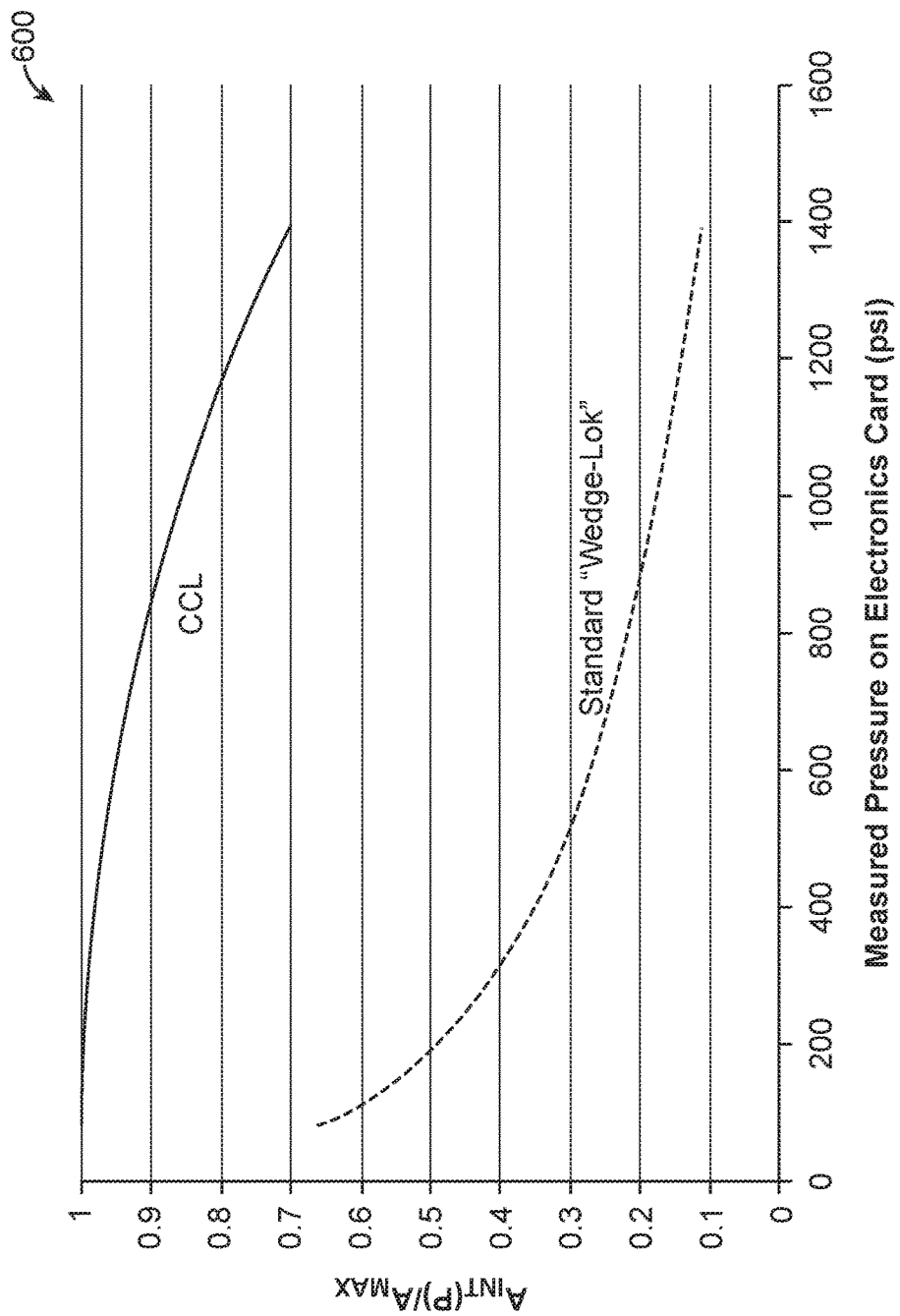
FIG. 6 is a graph of the ratio of measured interaction area and maximum interaction area versus measured pressure for a prior art card lock and a high-pressure card lock of the present disclosure.

As used herein and in the appended claims, pressure uniformity can be quantified by calculating the ratio:

$$\frac{A_{INT}(P)}{A_{MAX}}$$

wherein $A_{INT}(P)$ is the measured area of interaction between the lock and the card, which is a function of the applied pressure. $A_{MAX}$ is the maximum area of interaction between the lock and the card, which is a function of only the geometry and is independent of applied pressure. Using the pressure data from FIG. 4, the variation of this ratio can be plotted as shown in graph 600 FIG. 6. For a highly uniform pressure distribution that minimizes the contact resistance of the joint, the above ratio should be as close to 1 as possible. The card lock of the present disclosure maintains a ratio near unity up to about 350 psi (~2.41 MPa), decreasing to approximately 0.7 at 1400 psi (~9.65 MPa), as the torsional rigidity limit of the design is reached. Conversely, the COTS card lock has a ratio near or below 0.5 at low pressure (i.e. <350 psi (~2.41 MPa)) that decreases still further to approximately 0.1 at high pressures. Thus, the card lock of the present disclosure provides substantially better pressure uniformity at all applied pressures and therefore minimizes the joint thermal resistance.

Figure 7:
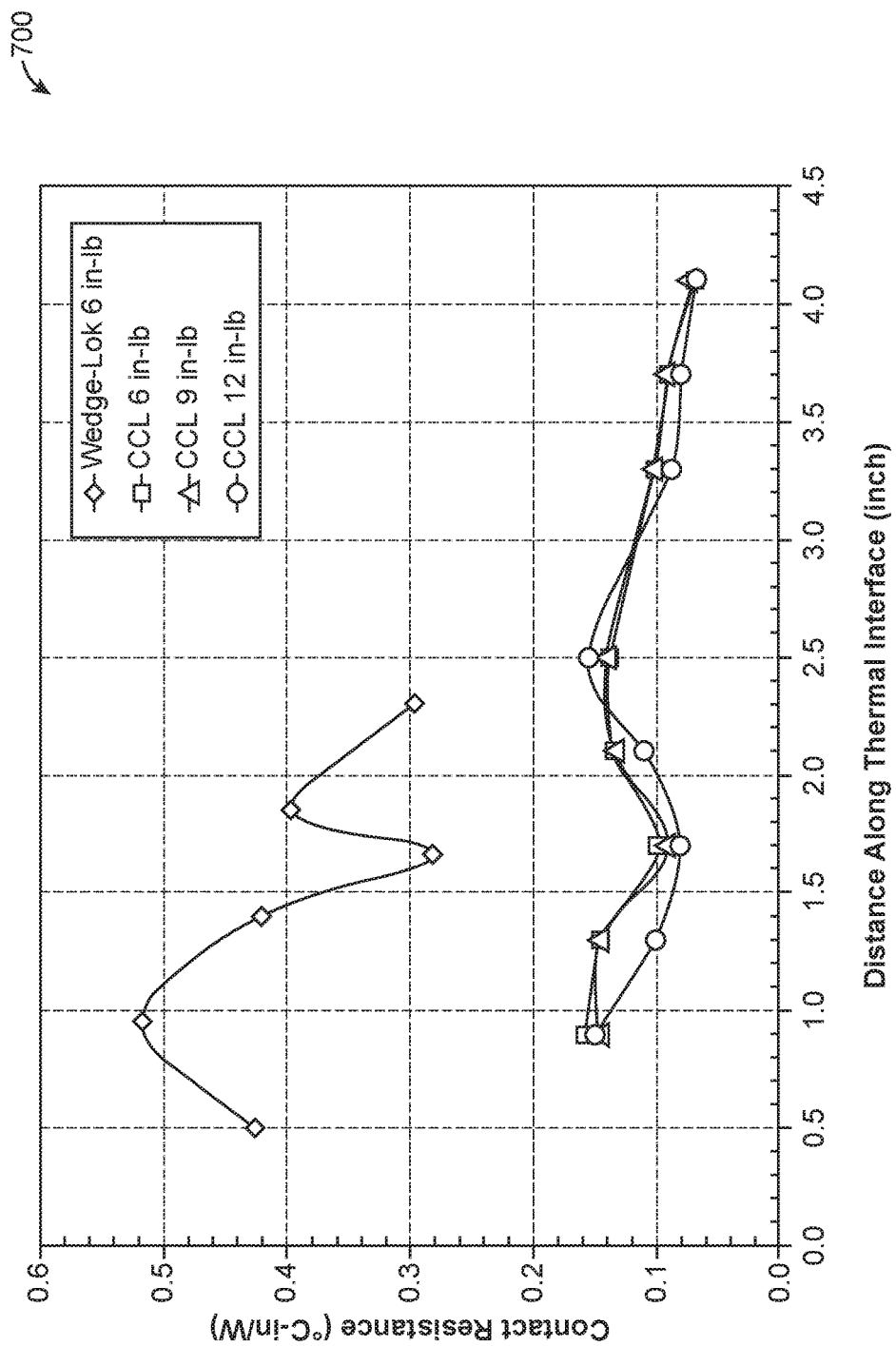
FIG. 7 is a graph of contact resistance versus distance along the thermal interface between an electronics card and an electronics card chassis for a prior art card lock and a high-pressure card lock of the present disclosure at three differing locking-screw torques.
Figure 8:
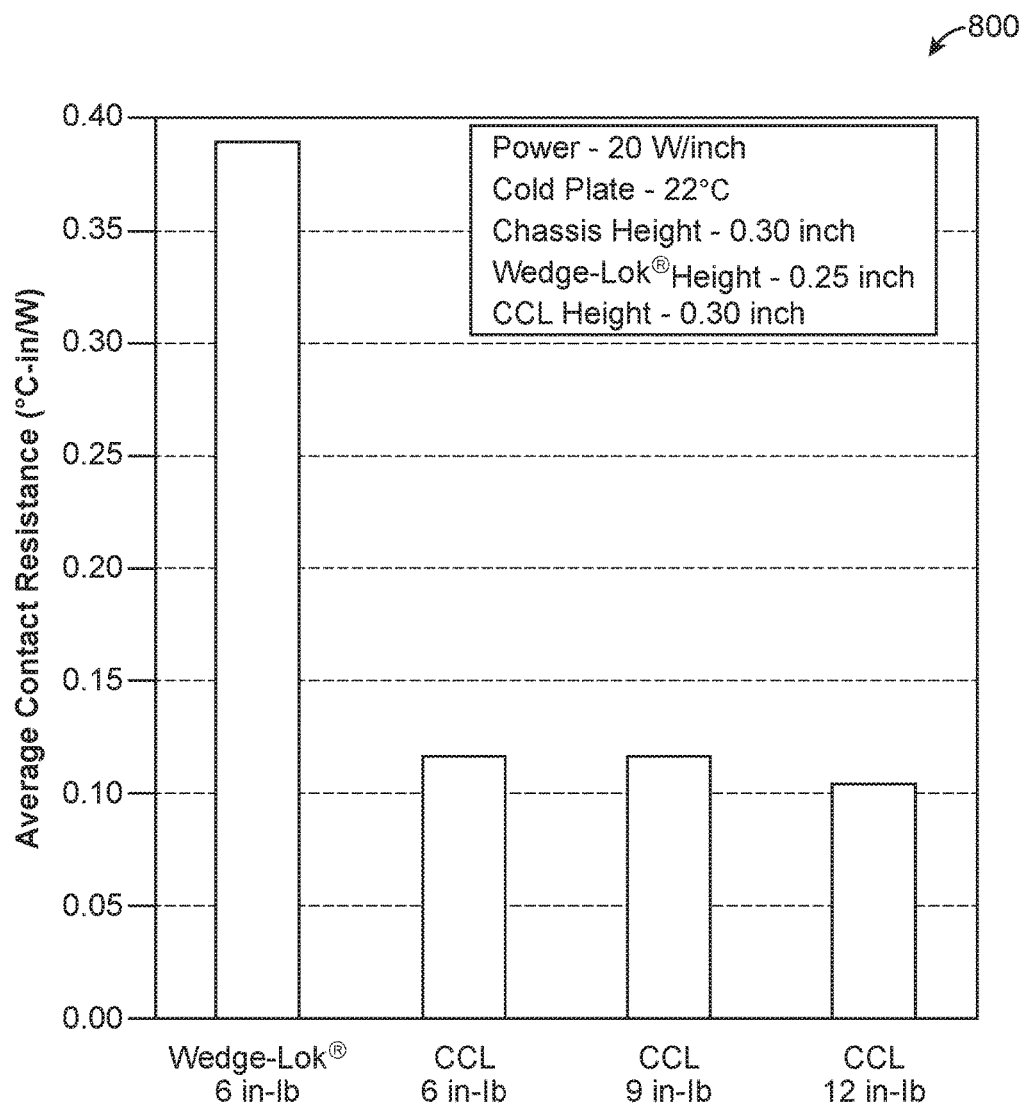
FIG. 8 is a graph of average contact resistance based on the data of the graph of FIG. 7.

FIG. 7 is a graph 700 illustrating contact resistance along the thermal interface for COTS card lock 10 of FIG. 1 (denoted "Wedge-Lok") and a prototype of a high-pressure card lock of the present disclosure (denoted "CCL" and that is the same as or similar to high-pressure card lock 200 of FIG. 2A) for a variety of applied torque values and interface configurations. Test results correspond to a 20 W/inch heat input to the card, a cold plate temperature of 22° C., and gold-plated thermal interfaces, which are typically used in advanced satellite applications. The COTS WEDGE-LOK® card lock produces the most non-uniformity along the thermal interface relative to the CCL, which dramatically reduces non-uniformity along the thermal interface at all test conditions. The electronics card and card cage heat sink used for the evaluation was of similar form, fit, and function to those used in space satellite and terrestrial applications. While graph 700 shows the thermal contact resistance along the thermal interface for a number of test configurations, FIG. 8 shows a graph 800 of the contact resistance averaged along the thermal interface. Large variability in the WEDGE-LOK® card lock is related to periodic contact and low mechanical stiffness, both of which are inherent in the design and construction of the device. These tests were conducted on an optimized aluminum-aluminum thermal interface and resulted in an average 0.39° C.-in./W contact resistance. The CCL results in a dramatic reduction in the variation in contact resistance, due to the more stringent machining tolerances used in the design and fabrication processes. In addition, the use of a gold-plated thermal interface, which is typical in satellite applications, helps to reduce the variation in contact resistance. This resulted in an average 0.11° C.-in./W contact resistance, which is a factor of 3.5 reduction from the baseline approach, and a factor of 10 below the industry standard for conventional wedge lock technology (~1° C.-in./W). In addition, the present inventors have demonstrated that a card lock made in accordance with the present invention can be installed and removed twenty times or more with no loss of performance and no galling of the chassis or the chassis slot. Such a card lock may include a lock and unlock mechanism facilitating straightforward installation and removal.

Referring again to FIG. 2A, in the exemplary high-pressure card lock 200 shown there, the lock and unlock mechanism 220 that enables movable wedge 204 to slide relative to stationary wedge 208 includes a high-strength "locking" screw 224 captured in the stationary wedge that interacts with a threaded hole 228 in the movable wedge. In this example, a counter-clockwise rotation of screw 224 causes movable wedge 204 to slide in a direction away from the head 224A of the screw (e.g., to a locking position), whereas a clockwise rotation of the screw causes the movable wedge to slide toward the head of the screw (e.g., to an unlocked position). In this embodiment, screw 224, which is captured in a U-shaped receiver 232 on an outstanding leg 236 fixedly joined to movable wedge 204 near the front face 240 of high-pressure card lock 200, is used to effect the lock and unlock features of the card lock during insertion and removal of one or more electronics cards in the electronics chassis. In other embodiments (not shown) not including locking screw 224, one or more locking-unlocking components on front face and/or on the exposed side(s) (running along the length of the electronics card—such as exposed sides 204B and 208B) of movable and/or stationary wedges 204 and 208 could be used to push and pull the relevant wedges relative to one another so as to move the wedges into their locked positions and, conversely pull and push the relevant wedges relative to one another so as to move the wedges into their unlocked positions. This could be achieved by means of a screw or by some other mechanical means, such as a draw-type latch mechanism, located on the side of the high-pressure card lock. While the locking mechanism may be both a locking and an unlocking mechanism, this is not necessary. For example, the force-resisting member (e.g., outstanding leg 236 on fixed wedge 208 in FIG. 2A) can be threaded and the corresponding screw can simply push against the other wedge, with no unlocking ability (i.e., turning the screw the other way would simply back-out the screw, leaving the wedge in place). In such embodiments, the movable wedge could be moved from its locked position in a variety of ways, including using a special tool that engages a feature on one side of the wedge that was originally pushed into place.

One embodiment of each of movable and stationary wedges 204 and 208 is a solid wedge that is precisely machined to a predetermined inclination angle with features to enable the locking and unlocking of high-pressure card lock 200. In some embodiments, the inclination angle may be (about) 5° or less, such as in a range of (about) 5° to (about) 1° or in a range of (about) 3° to (about) 1°. A solid wedge adds mechanical rigidity, and wedge 204 and 208 may be made out of any one or more of several materials including, but not limited to, Nitronic 60 (stainless steel), aluminum alloy, and titanium alloy, or any one or more of a number of other materials such as metals, metal alloys, polymers, ceramics, composites, etc. As mentioned above, while in some embodiments the thermal conductivity of the material used for the wedges can be relatively high, such as 400 W/mK, in other embodiments, the material used for the wedges can have a lower thermal conductivity, such as (about) 200 W/mK or less, (about) 100 W/mK or less, or (about) 25 W/mK or less. As examples: when aluminum alloy is used, the thermal conductivity will be about 170 W/mK; when stainless steel is used, the thermal conductivity will be about 15 W/mK; and when titanium alloy is used, the thermal conductivity will be about 9 W/mK. Such low thermal conductivities are in direct contrast to the teachings of the '764 patent that the thermal conductivity of a wedge lock needs to be maximized, such as by using copper, which has a thermal conductivity of about 400 W/mK.

The sliding interface between the faces 204A and 208A of movable and stationary wedges 204 and 208 may be coated with a low-friction coating, or not. To maximize the force multiplier, M, the friction coefficient should preferably be minimized. From a practical perspective, the friction coefficient is preferably 0.15 or less. This can be achieved with commercially available coatings or a precision machined, for example, or polished, surface having low surface roughness. This has the added beneficial effect of reducing stiction, which is the initial resistance to sliding, which in this case corresponds to the loosening of a tightened card lock. Examples of low-friction coatings that can be used include molybdenum sulfide and diamond-like carbon coating, among others.

FIGS. 9A to 9C illustrate a high-pressure card lock 900 that is a modified version of high-pressure card lock 200 of FIGS. 2A to 2C in which the movable and stationary wedges 904 and 908, respectively, are secured together at a location away from the screw by a securing pin 912 (FIG. 9B) to keep the two wedges laterally aligned with one another. In this example, securing pin 912 is press fit into a hole in stationary wedge 908 (the hole is not shown because it is in the portion cut away for illustrative purposes in FIG. 9B) and includes a head 912A located in and slidably engaged with a T-shaped (in transverse cross section) slot 916 in movable wedge 904. As seen in FIG. 9B, access to T-shaped slot 916 for initially engaging headed securing pin 912 with the T-shaped slot is provided by T-shaped lateral opening 920, which here is shown as being closed by a closure 924 to keep the headed securing pin engaged with movable wedge 904 when high-pressure wedge lock 900 is not in use, such as during handling. FIG. 9C shows an example of how a first headed end 928A of a locking screw 928 may be captured in a T-shaped slot 932 within movable wedge 904 to allow the locking screw, which is threadedly engaged with a threaded hole (not shown) within outstanding leg 936 affixed to stationary wedge 908, to extend and retract the movable wedge relative to the outstanding leg. In this example, T-shaped slot 932 extends from one side of movable wedge 904 (nearest the viewer in FIG. 9C) to a location that allows the locking screw to longitudinally extend parallel to the longitudinal axis of high-pressure card lock 900. Once first headed end 928A of locking screw 928 has been engaged with T-shaped slot 932, the T-shaped slot may be closed by a suitable closure 940 (only a small part of which is shown in FIG. 9C due to the cutaway). As those skilled in the art will appreciate, because locking screw 928 is threadedly engaged with outstanding leg 936 and is captured in T-shaped slot 932, as a user turns second headed end 928B of the locking screw, for example, with a screwdriver, the second headed end moves left or right (relative to FIG. 9C), depending on the direction of turning, and movable wedge 904 moves in unison with the second headed end. It is noted that FIG. 9C shows movable wedge 904 fully extended, with second headed end 928B in contact with outstanding leg 936.

FIG. 10 is an exploded view illustrating another embodiment of a high-pressure card lock 1000 of the present invention as having first and second wedges 1004 and 1008 and including a long screw 1012 that extends largely the length of the high-pressure card lock and threadedly engages a threaded hole 1016 at the thicker end 1004A of the first wedge. In this embodiment, the precisely machined first and second wedges 1004 and 1008 each have a channel 1120 and 1124, respectively, machined along their lengths to accommodate screw 1012. In some embodiments, each channel 1120 and 1124 may be narrowed in precise locations (not shown) along its length to prevent high-strength screw 1012 from buckling under the compression that develops when turning the screw to unlock high-pressure card lock 1000.

In this embodiment, screw 1012 includes an annular boss 1012A that, when high-pressure card lock 1000 is assembled, is captured in a U-shaped recess 1028 so as to prevent the screw from moving longitudinally. Thus, when screw 1012 is turned, opposing forces are imparted to first and second wedges 1004 and 1008 via threaded hole 1016 and recess 1028, respectively. In some embodiments, counter-clockwise rotation of screw 1012 causes first wedge 1004 to slide in a direction away from the head 1012B of screw 1012 in an unlocking direction, whereas a clockwise rotation of the screw causes the upper wedge to slide toward the screw head in a locking direction. As in the embodiment described above in connection with FIGS. 2A to 2C, the sliding interface 1004B and 1008B between first and second wedges 1004 and 1008, respectively, may be coated with a low-friction coating, or not, and the same overall requirements apply for this embodiment as in the prior embodiment. In some embodiments, screw 1012 is fabricated from a high-strength material, such as stainless steel or titanium alloy.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A card lock for locking an electronics card into a card cage, the card lock comprising:
   a first wedge that tapers in thickness from a first end to a second end;
   a second wedge that tapers in thickness from a third end to a fourth end, wherein the second wedge is located so that the third end is located proximate to the second end of the first wedge; and
   a locking mechanism that includes:
      a fixed portion fixedly secured to the first wedge at the second end of the first wedge; and
      a pusher engaged with each of the fixed portion and the second wedge, the pusher designed and configured to act against the fixed portion to push the second wedge along the first wedge so as to expand the card lock;
   wherein:
      each of the first and second wedges has a taper in a range of 1° to 3°;
      the first wedge includes a first inclined face and the second wedge includes a second inclined face engaging the first inclined face in sliding contact at a frictional interface having a friction coefficient of 0.1 or less; and
      the friction coefficient and the taper contribute to the card lock having a force multiplier of at least 6 as between a compressive force applied by the pusher to the second wedge and a compressive force applied by the first and second wedges to a card-lock channel of an electronics card cage.

2. A card lock according to claim 1, wherein the first wedge includes a first inclined face and the second wedge includes a second inclined face designed and configured to sliding engage the first inclined face, the card lock further comprising a retainer extending between the first and second inclined faces and designed and configured to inhibit relative lateral movement between the first end of the first wedge and the fourth end of the second wedge.

3. A card lock according to claim 1, wherein the first wedge includes a first inclined face and the second wedge includes a second inclined face designed and configured to engage the first inclined face in sliding at a frictional interface, at least one of the first and second inclined faces including a low-friction coating at the frictional interface.

4. A card lock according to claim 1, wherein each of the first and second wedges is substantially solid.

5. A card lock according to claim 4, wherein each of the first and second wedges is made of a material having a thermal conductivity of less than 200 W/mK.

6. A card lock according to claim 5, wherein the thermal conductivity is less than 100 W/mK.

7. A card lock according to claim 6, wherein the thermal conductivity is less than 25 W/mK.

8. An assembly, comprising:
   a chassis having at least one card slot having a thermally conductive sidewall;
   an electronics card having a length, the electronics card engaged in the at least one card slot so as to be in contact with the thermally conductive sidewall along the length of the electronics card; and
   a card lock according to claim 1, wherein the card lock is engaged in the at least one card slot so as to force the electronics card into firm contact with the thermally conductive sidewall so that pressure of the electronics card against the thermally conductive sidewall is at least 85 psi (0.59 MPa) along substantially the entire length of the portion of the card lock in contact with the electronics card.

9. An assembly according to claim 8, wherein the pressure is at least 350 psi (2.41 MPa).

10. An assembly according to claim 9, wherein the contact of the card lock with the electronics card has a pressure uniformity of at least 0.8.

11. An assembly according to claim 9, wherein the contact of the card lock with the electronics card has a pressure uniformity of at least 0.9.

12. An assembly according to claim 8, wherein the pressure is at least 1000 psi (6.90 MPa).

13. An assembly according to claim 12, wherein the contact of the card lock with the electronics card has a pressure uniformity of at least 0.7.

14. An assembly according to claim 12, wherein the contact of the card lock with the electronics card has a pressure uniformity of at least 0.8.

15. An assembly according to claim 12, wherein the contact of the card lock with the electronics card has a pressure uniformity of at least 0.5.

16. An assembly according to claim 12, wherein the contact of the card lock with the electronics card has a pressure uniformity of at least 0.65.

17. An assembly according to claim 8, wherein the pressure is at least 1400 psi (9.65 MPa).

* * * * *